United States Patent
Tabata

(10) Patent No.: US 8,415,998 B2
(45) Date of Patent: Apr. 9, 2013

(54) PLL CIRCUIT

(75) Inventor: Mitsushi Tabata, Yokohama (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/241,549

(22) Filed: Sep. 23, 2011

(65) Prior Publication Data

US 2012/0154000 A1 Jun. 21, 2012

(30) Foreign Application Priority Data

Dec. 15, 2010 (JP) ................................. 2010-279341

(51) Int. Cl.
*H03L 7/07* (2006.01)
(52) U.S. Cl.
USPC .......................................... 327/156; 327/147
(58) Field of Classification Search .................. 327/147, 327/156
See application file for complete search history.

(56) References Cited

U.S. PATENT DOCUMENTS

| | | | |
|---|---|---|---|
| 7,183,862 B2 | 2/2007 | Takase | |
| 7,268,629 B2 | 9/2007 | Takase | |
| 8,076,962 B2 * | 12/2011 | Chen et al. ..................... | 327/157 |
| 2005/0189973 A1 * | 9/2005 | Li ................................ | 327/157 |
| 2006/0068737 A1 * | 3/2006 | Koo et al. ....................... | 455/260 |
| 2008/0191746 A1 * | 8/2008 | Friedman et al. ................. | 327/5 |
| 2008/0292040 A1 * | 11/2008 | Menolfi et al. ................. | 375/376 |
| 2009/0034650 A1 * | 2/2009 | Norimatsu et al. ........... | 375/295 |
| 2011/0063004 A1 * | 3/2011 | Chen et al. ..................... | 327/157 |
| 2012/0049956 A1 * | 3/2012 | Lam ............................. | 330/253 |
| 2012/0106689 A1 * | 5/2012 | Byun ............................ | 375/374 |

FOREIGN PATENT DOCUMENTS

| JP | 10-233681 A | 9/1998 |
|---|---|---|
| JP | 2006-333489 A | 12/2006 |
| JP | 2006-345512 A | 12/2006 |

* cited by examiner

*Primary Examiner* — Adam Houston
(74) *Attorney, Agent, or Firm* — Fujitsu Patent Center

(57) ABSTRACT

A PLL circuit, has a phase comparator for comparing phases of a reference clock and a feedback clock, and outputting a phase comparison signal indicating the phase difference; a charge pump circuit, which, during a time period corresponding to the phase difference, outputs a first charge pump current and a second charge pump current; a loop filter, having a capacitor storing electric charge based on the first and second charge pump currents, which generates a control voltage due to stored electric charge; an oscillator generating an output clock at a frequency according to the control voltage; a frequency divider frequency-dividing the output clock and outputs the feedback clock; and a charge pump adjustment circuit, which, when in a locked state, adjusts current quantity of the first or the second charge pump current such that the phase difference is suppressed, according to the phase difference indicated by the phase comparison signal.

8 Claims, 9 Drawing Sheets

PLL CIRCUIT

CROSS-REFERENCE TO RELATED APPLICATION

This application is based upon and claims the benefit of priority of the prior Japanese Patent Application No. 2010-279341, filed on Dec. 15, 2010, the entire contents of which are incorporated herein by reference.

FIELD

This invention relates to a PLL circuit.

BACKGROUND

A PLL circuit has a phase comparator which compares the phases of an input reference clock and a feedback clock obtained by division by N (where N is a positive number) of the output clock of the PLL circuit; a charge pump circuit which generates a current according to the phase difference; a loop filter which integrates this current; an oscillation circuit which generates an output clock at a frequency according to the control voltage output by the loop filter; and a frequency divider which divides this output clock by N and generates a feedback clock. In general, the output clock is a high-speed clock having a frequency which is N times the reference clock.

PLL circuits generate an output clock having a phase coinciding with or matched to the phase of the reference clock, and are widely used when high-frequency clocks matched to the timing of a reference clock are needed.

PLL circuits are discussed in Japanese Patent Laid-open No. 2006-345512, Japanese Patent Laid-open No. 2006-333489, and Japanese Patent Laid-open No. 10-233681.

Ideally in a PLL circuit, the control voltage and the output clock of the oscillation circuit are constant in a state in which the phases of the reference clock and feedback clock coincide. This state is the locked state of the PLL circuit.

However, due to variation in processes to manufacture integrated circuit devices, variation in temperature, variation in power supply voltage, and diverse other variation, even when in the locked state, there are cases in which the phases of the reference clock and feedback clock are steadily shifted. Such a phase shift is called a steady-state phase error.

When the lock state is entered while this steady-state phase error is occurring, the shift between the output clock phase and the reference clock phase remains unchanged, and the output clock timing does not agree with the reference clock timing. Consequently, when for example using the output clock as a sampling clock for input data matched to the timing of the reference clock, if the data rate of the input data is fast, sampling occurs with erroneous timing, and erroneous input data is captured.

SUMMARY

A PLL circuit, has: a phase comparator, which compares phases of a reference clock and a feedback clock, and outputs a phase comparison signal indicating a difference between the phases; a charge pump circuit, which, during a time period corresponding to the difference in phases indicated by the phase comparison signal, outputs a first charge pump current and a second charge pump current; a loop filter, which has a capacitor storing electric charge based on the first and second charge pump currents, and which generates a control voltage due to stored electric charge; an oscillator, which generates an output clock at a frequency according to the control voltage; a frequency divider, which frequency-divides the output clock and outputs the feedback clock; and a charge pump adjustment circuit, which, when in a locked state, adjusts current quantity of the first or the second charge pump current such that the phase difference is suppressed, according to the phase difference indicated by the phase comparison signal.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Figure 1:
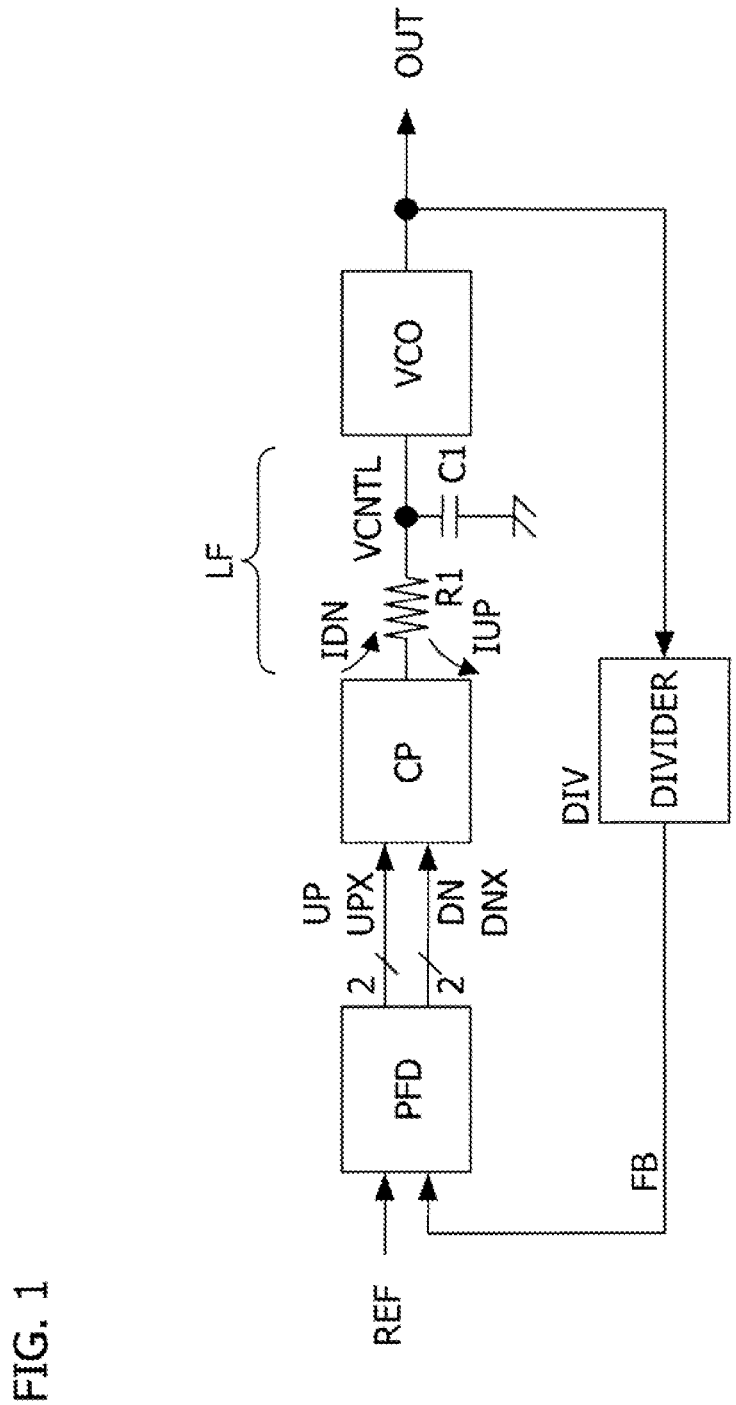
FIG. 1 illustrates the configuration of a PLL circuit.

FIG. 1 illustrates the configuration of a PLL circuit. The PLL circuit has a phase comparator PFD which compares the phases of a reference clock REF and a feedback clock FB; a charge pump CP which generates charge currents IDN, IUP according to phase comparison signals UP (UPX) and DN (DNX) output by the phase comparator; a loop filter LF which integrates the charge current of the charge pump; a voltage-controlled oscillator VCO which controls the frequency of the output clock OUT according to the control voltage VCNTL generated by the loop filter; and a frequency divider DIV which divides the frequency of the output clock OUT by N and generates the feedback clock FB. The phase comparison signals UP, DN are signals indicating the differences in phase of the clocks REF, FB. The phase comparison signal DNX is the inverted-logic signal of DN, and UPX is the inverted-logic signal of UP.

The charge pump circuit CP generates a positive charge pump current IDN or a negative charge pump current IUP according to the phase comparison signals UP, UPX, DN, DNX. These charge pump currents are for example output for time periods corresponding to the difference in phase indicated by the phase comparison signals.

The loop filter LF comprises for example a resistor R1 and capacitor C1; charge accumulates on the capacitor C1 due to the positive charge pump current IDN, so that the control voltage VCNTL rises, while charge is removed from the capacitor C1 by the negative charge pump current IUP, so that the control voltage VCNTL falls. That is, the control voltage VCNTL is the voltage due to charge stored on the capacitor C1.

In this PLL circuit, for example, when the phase of the feedback clock FB lags the phase of the reference clock REF, the charge pump circuit CP outputs a negative charge current IUP based on the phase comparison signal UP, charge is removed from the capacitor C1 of the loop filter LF, and the control voltage VCNTL falls. As a result, the voltage-controlled oscillator VCO raises the frequency of the output clock OUT accompanying the fall in the control voltage VCNTL. Due to the rise in frequency, the phases of the output clock OUT and feedback clock FB advance, and the phase difference with the reference clock becomes smaller.

Conversely, when the phase of the feedback clock FB leads the phase of the reference clock REF, the operation is opposite that described above.

In the following explanation also, it is assumed that circuits for a phase comparator PFD, charge pump CP, and voltage-controlled oscillator VCO are configured so as to be in the relationship described above.

However, by means of the configuration of the voltage-controlled oscillator, the charge currents IUP/IDN and frequency of the output clock OUT may be in a relation opposite that described above. The relation between the phase comparator PFD and charge pump CP and similar may likewise be different from the above.

Figure 2:
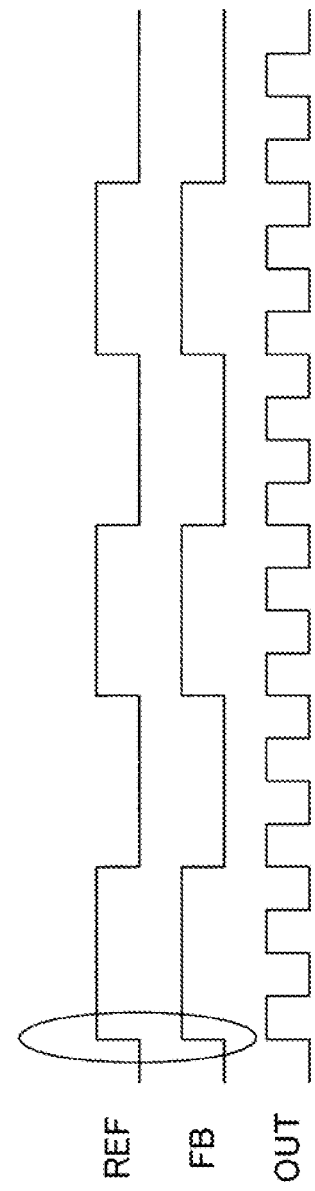
FIG. 2 is a waveform diagram of the ideal locked state of a PLL circuit.

FIG. 2 is a waveform diagram of the ideal locked state of a PLL circuit. In FIG. 2, the reference clock REF, feedback clock FB, and output clock OUT are illustrated. The output clock OUT is a high-speed clock having a frequency N times that of the reference clock REF.

In the ideal locked state, as illustrated in FIG. 2, the phases of the reference clock REF and feedback clock FB coincide, and the phase difference is zero.

Figure 3:
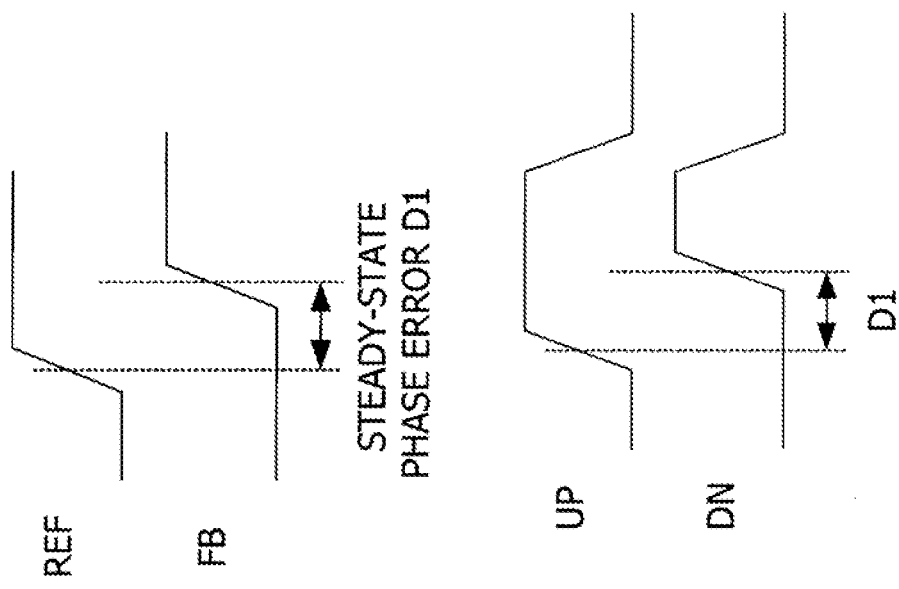
FIG. 3 is a waveform diagram of a problematic locked state of a PLL circuit.

FIG. 3 is a waveform diagram of a problematic locked state of a PLL circuit. Despite the fact that the PLL circuit is in a locked state, a phase error D1 remains between the reference clock REF and the feedback clock FB. Because the state is a locked state, the frequencies of the output clock OUT and the feedback clock FB obtained by frequency division thereof are in a constant state. However, a steady-state phase error D1 occurs between the reference clock REF and the feedback clock FB, and the pulse widths of the phase comparison signals UP and UN are different.

The phase comparator PFD generates phase comparison signals UP, DN which indicate the difference in the phases of the reference clock REF and the feedback clock FB for example. For example, the phase comparison signals UP, DN have pulse widths corresponding to the difference in phase between the clocks. In the example of FIG. 3, the phase comparator raises the phase comparison signal UP in response to the rising edge of the reference clock REF, raises the phase comparison signal DN in response to the rising edge of the feedback clock FB, and thereafter simultaneously lowers both signals UP and DN. That is, the phase comparison signal corresponding to the clock with the advanced phase has a pulse width which is longer by the phase difference amount.

The charge pump circuit CP generates a negative charge pump current IUP which removes charge while the phase comparison signal UP is at H level, and generates a positive charge pump current IDN which injects charge while the phase comparison signal DN is at H level. Hence the charge pump circuit CP causes the positive or negative charge pump current IDN, IUP to occur longer for a time period corresponding to the phase difference, and causes the output voltage VCNTL of the loop filter LF to rise or fall.

The reason for the occurrence of the steady-state phase error D1 illustrated in FIG. 3 in the locked state is the occurrence of an imbalance in the current values of the charge pump currents IDN, IUP of the charge pump circuit CP. That is, the cause is an imbalance in the current driving capacity of the circuit generating the charge pump current of the charge pump circuit.

Figure 4:
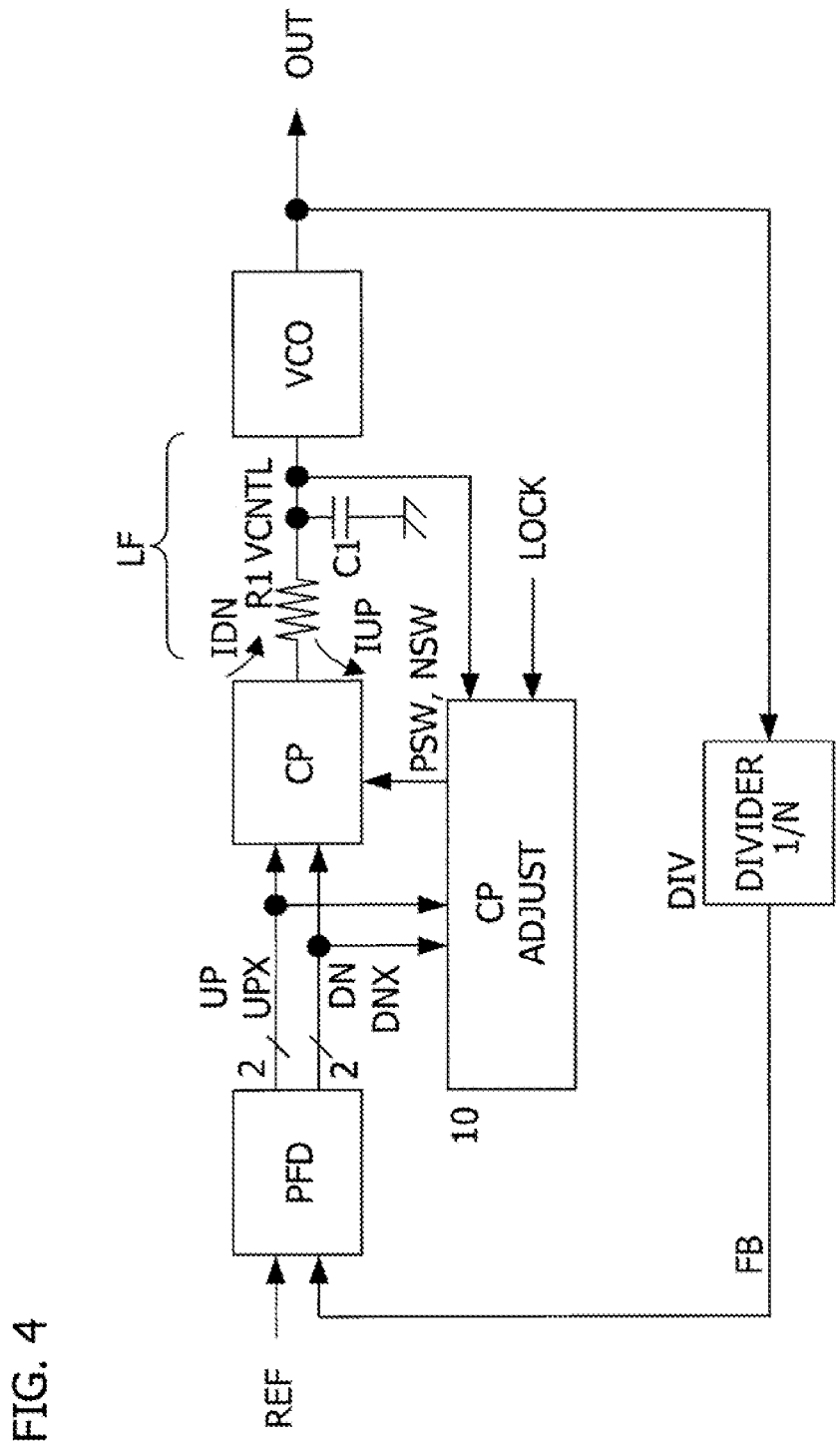
FIG. 4 illustrates the configuration of the PLL circuit of this embodiment.

FIG. 4 illustrates the configuration of the PLL circuit of this embodiment. This PLL circuit, similarly to the PLL circuit of FIG. 1, has a phase comparator PFD; a charge pump circuit CP; a loop filter LF; a voltage-controlled oscillator VCO; and a frequency divider DIV. And, the PLL circuit has a charge pump adjustment circuit 10, which, in the locked state, adjusts the current values IUP, IDN of the positive and negative charge pump currents of the charge pump circuit CP according to the phase comparison signals UP, DN (including UPX, DNX). Through this adjustment of the charge pump current, the imbalance in the two current values is suppressed, and the steady-state phase error in the locked state is suppressed. Ideally, control is executed to cause the steady-state phase error to be zero.

For example, when as in FIG. 3 the phase of the feedback clock FB lags the phase of the reference clock REF, the pulse width of the first phase comparison signal UP is wider than the pulse width of the second phase comparison signal DN. The charge pump circuit CP generates the charge pump currents IUP, IDN during the time periods of the pulse widths of the phase comparison signals UP and DN respectively, and so the occurrence of the steady-state phase error D1 in the locked state means that the current value of the negative charge pump current IUP is smaller than the current value of the positive charge pump current IDN. This is because in the locked state, the voltage of the control voltage VCNTL of the voltage-controlled oscillator VCO is constant, and the frequency of the output clock OUT is constant. Despite the fact that the voltage of the control voltage VCNTL is constant, the fact that the pulse width of the first phase comparison signal UP is wider than the pulse width of the second phase comparison signal DN means that the current value of the negative charge pump current IUP is smaller than the positive charge pump current IDN, and that when the negative charge pump current IUP is output over a longer time period, the charge amounts of the two charge pump currents are balanced.

The charge pump adjustment circuit 10 performs adjustment so as to suppress the imbalance in the current values of the charge pump currents IPU and IDN in the charge pump circuit CP based on the direction (whether FB or REF is advanced in phase) and magnitude (phase difference) of the steady-stage phase error D1 in the locked state. Specifically, adjustment is performed to suppress the imbalance in the current driving capacity of the circuit generating the charge pump currents.

That is, in the case of the example of FIG. 3, either the current driving capacity of the circuit which generates the negative charge pump current IUP is increased, or the current driving capacity of the circuit which generates the positive charge pump current IDN is decreased. As a result, in the locked state, the phase comparison signals UP and DN are made to have the same pulse width, that is, a state will be obtained in which the phases of the feedback clock FB and the reference clock REF coincide.

Figure 5:
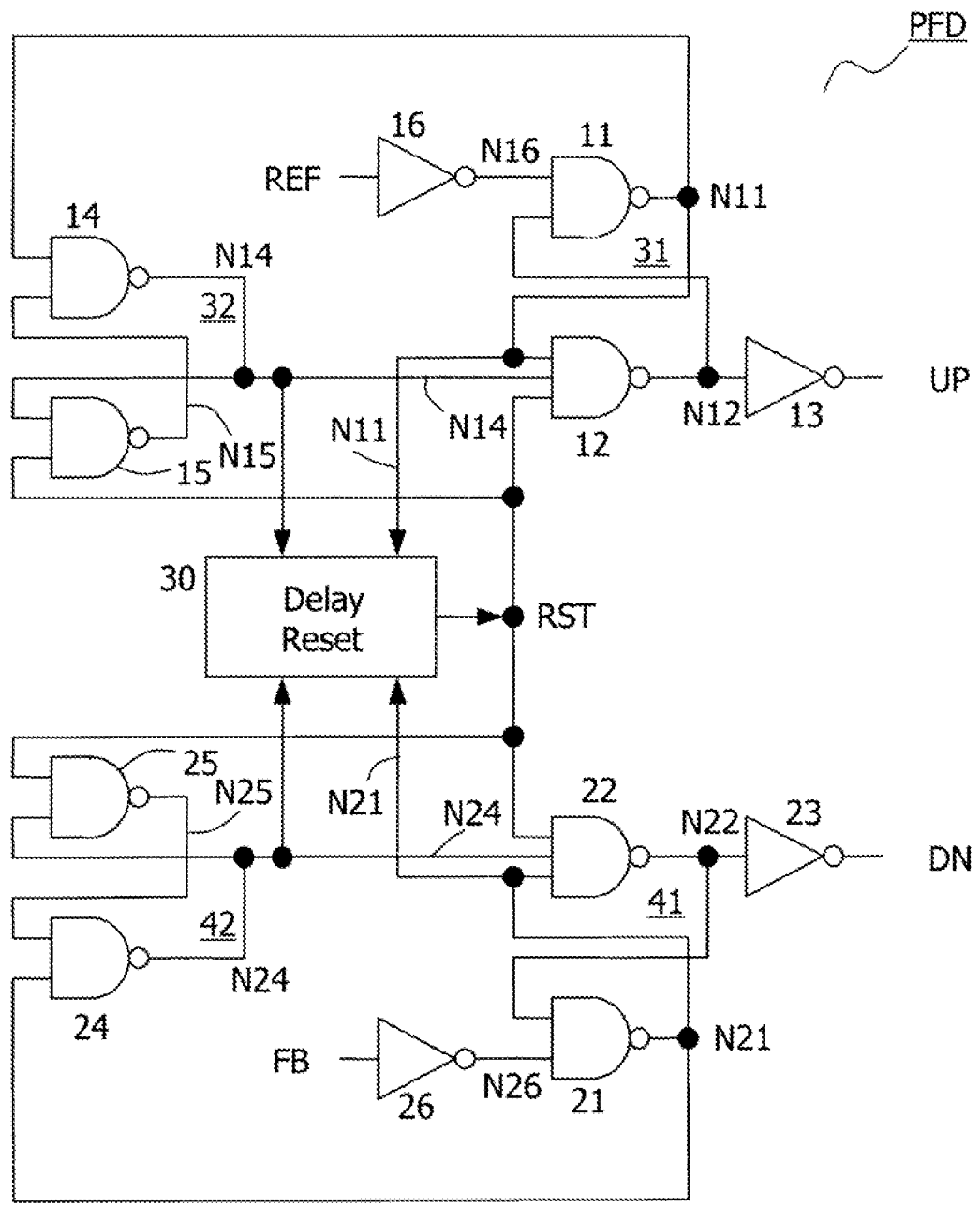
FIG. 5 is a circuit diagram of the phase comparator PFD of the PLL circuit of this embodiment.

FIG. 5 is a circuit diagram of the phase comparator PFD of the PLL circuit of this embodiment. In this phase comparator PFD, the circuit of gates 11 to 16 raises the phase comparison signal UP in response to the rising edge of the reference clock REF, and the circuit of gates 21 to 26 raises the phase comparison signal DN in response to the rising edge of the feedback clock FB. Further, the gates 11 and 12 constitute a latch circuit 31, and the gates 14 and 15 constitute a latch circuit 32. The gates 21 and 22 constitute a latch circuit 41, and the gates 24 and 25 constitute a latch circuit 42.

(1) In the initial state, the reset signal RST is driven to L level by the delay reset circuit 30, and when the reference clock REF is at L level, the latch circuits 31 and 32 are in the following states.
N16=H, N12=H, UP=L, so that N11=L, and N15=H, so that N14=H.

Similarly, when the reset signal RST=L level and the feedback clock FB is at L level, the latch circuits 41 and 42 are in the following states.
N26=H, N22=H, DN=L, so that N21=L, and N25=H, so that N24=H.

(2) Next, after reset is cancelled and RST has gone to H level, when as in the example of FIG. 3 the reference clock REF rises to H level, the latch circuit 31 is inverted, and the following results.
N16=L, so that N15=L, N11=H, and N14=H, RST=H, so that N12 switches to L, and UP rises to H level.

Further, when the feedback clock FB rises to H level, the latch circuit 41 is inverted, and the following results.
N26=L, so that N25=L, N21=H, and N24=H, RST=H, so that N22 switches to L, and DN rises to H level.

(3) After a constant time has elapsed after N11 and N21 both go to H level, the delay reset circuit 30 drives the reset signal RST to L. In response to this, the latch circuits 31 and 32 change as follows.
N12=H, and UP falls to L level.
Further, N15=H, and N11=H, so that N14 goes to L, and the latch circuit 32 is inverted.

Similarly, in response to RST=L, the latch circuits 41, 42 change as follows.
N22=H, and DN also falls to L.
Further, N25=H, and N21=H, so that N24 goes to L, and the latch circuit 42 is also inverted.

(4) Finally, when the reference clock REF falls to L level, the latch circuit 31 is inverted, and the following occurs.
N16=H, and N12=H, so that N11 goes to L.
Further, because N11=L, N14 goes to H.

Similarly, when the feedback clock FB falls to L level, the latch circuit 41 is inverted, and the following occurs.
N26=H, and N22=H, so that N21 goes to L.
Further, because N21=L, N24 goes to H.

When at least one among N11, N14, N21 and N24 goes to L level, the delay reset circuit 30 drives the reset signal RST to H and cancels reset. In this state, when either REF or FB again goes to H level, the operation (2) is performed.

From the circuit example of FIG. 5, it is understood that the phase comparator PFD compares the phases of the reference clock REF and the feedback clock FB, and that the phase comparison signals UP and DN indicating the phase difference thereof become pulse signals as illustrated in FIG. 3. In this example, differences in the pulse widths of the two signals correspond to the phase difference.

Figure 6:
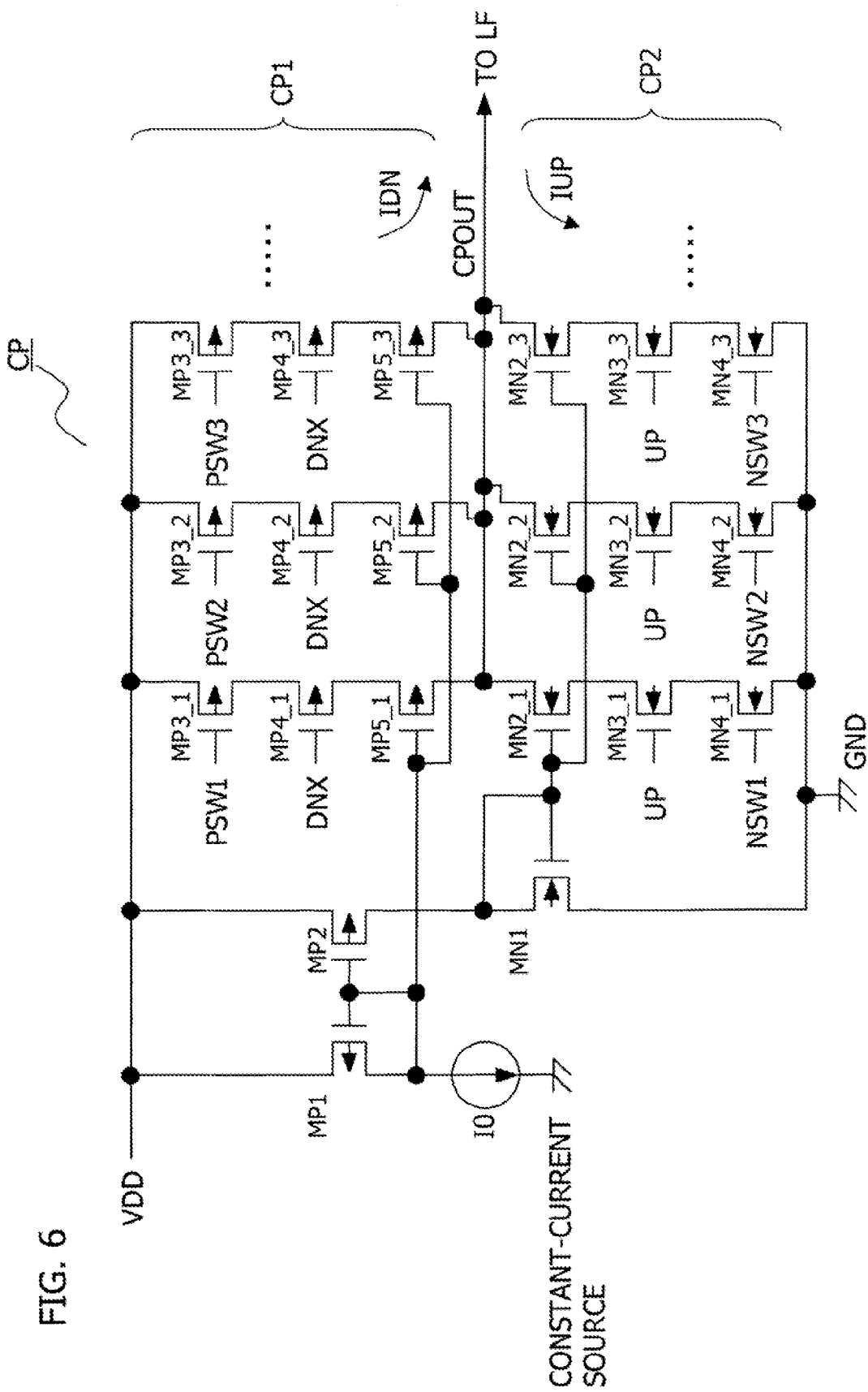
FIG. 6 is a circuit diagram illustrating one example of a charge pump circuit CP.

FIG. 6 is a circuit diagram illustrating one example of a charge pump circuit CP. The charge pump circuit has a first current generation circuit CP1 comprising P channel transistors and which generates the positive charge pump current IDN, and a second current generation circuit CP2 comprising N channel transistors and which generates the negative charge pump current IUP.

Further, in the charge pump circuit, first current mirror circuits are formed by a constant-current source 10 and P channel transistors MP1, MP2, MP5_1, 5_2, 5_3, and so on, and second current mirror circuits are formed by N channel transistor MN1, MN2_1, 2_2, 2_3 and so on. A plurality of series circuits, formed by the first current mirror circuit MP5_1, 5_2, 5_3 and so on, the P channel transistors MP4_1, 4_2, 4_3 and so on which are controlled to be conducting or non-conducting by the phase comparison signal DNX generated by the phase comparator PFD, and the P channel transistors MP3_1, 3_2, 3_3 and so on which are controlled to be conducting or non-conducting by current adjustment signals PSW1, 2, 3 and so on output by the charge pump adjustment circuit 10, described below, are connected in parallel between the output terminal CPOUT and the power supply VDD, to form the first current generation circuit CP1. And, the greater the number of L levels of the current adjustment signals PSW1, 2, 3, and so on, the greater is the number of series circuits which generate positive charge currents IDN, so that the current value of the positive charge current IDN is larger.

Further, a plurality of series circuits, formed by the second current mirror circuits MN2_1, 2_2, 2_3 and so on, N channel transistors MN3_1, 3_2, 3_3 and so on which are controlled to be conducting or non-conducting by the phase comparison signal UP generated by the phase comparator PFD, and N channel transistors MN4_1, 4_2, 4_3 and so on which are controlled to be conducting or non-conducting by current adjustment signals NSW1, 2, 3 and so on output by the charge pump adjustment circuit 10 described below, are connected in parallel between the output terminal CPOUT and ground GND, to form the second current generation circuit CP2. And, the greater the number of H levels of the current adjustment signals NSW1, 2, 3 and so on, the greater is the number of series circuits which generate negative charge currents IUP, so that the current value of the negative charge current IUP is larger.

FIG. 6 illustrates only three series circuits each on the P channel transistor side and on the N channel transistor side, but for example eight series circuits each, having transistors MP5_1 and so on and MN2_1 and so on constituting current mirror circuits with the same gate width, may be provided to make possible adjustment of the charge pump currents IDN, IUP in eight stages. Or, transistors constituting three current mirror circuits each having gate widths related as powers of 2 may be provided, to make possible adjustment of current values in eight stages.

Figure 7:
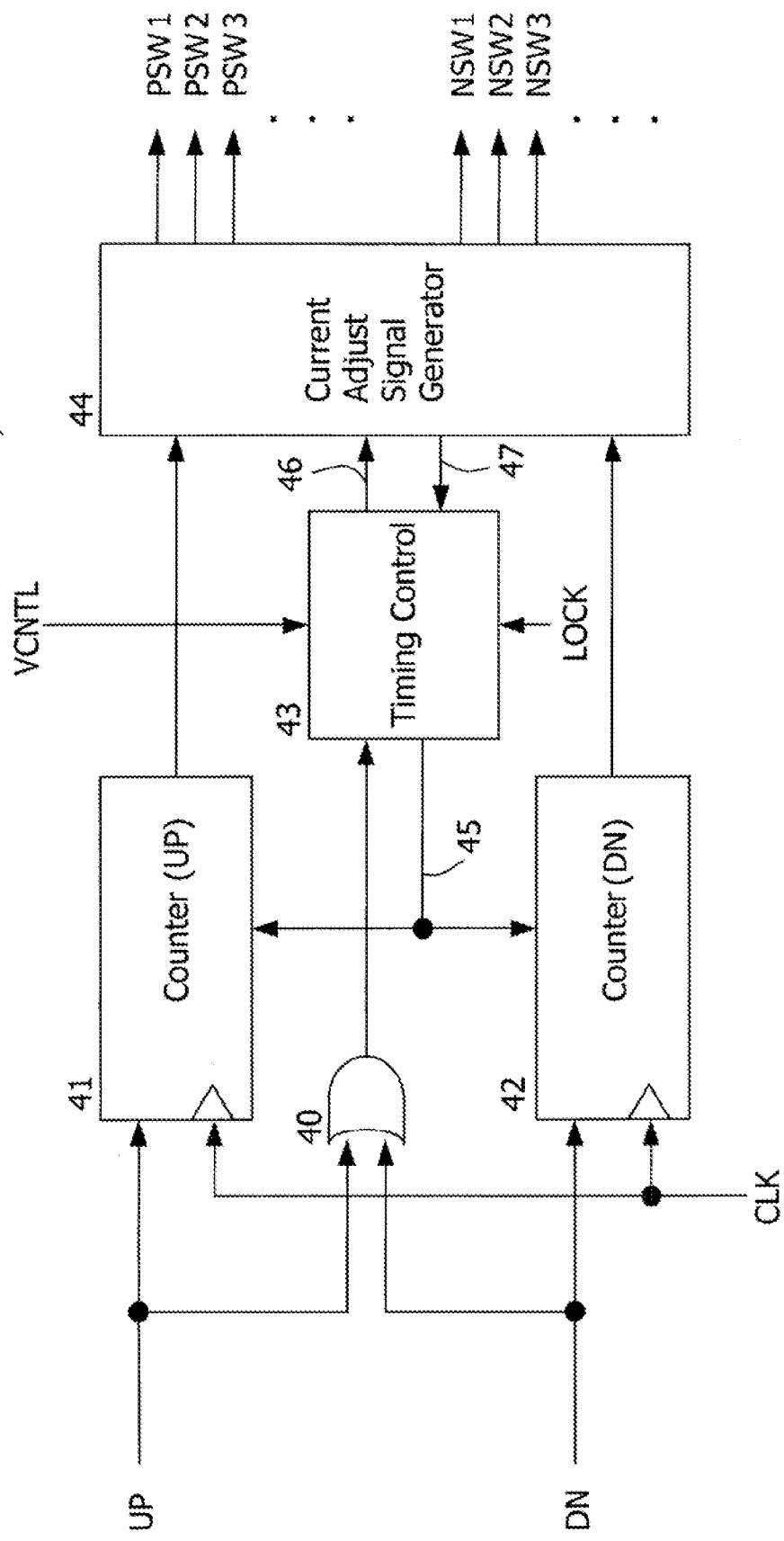
FIG. 7 illustrates the configuration of the charge pump adjustment circuit 10.

FIG. 7 illustrates the configuration of the charge pump adjustment circuit 10. The charge pump adjustment circuit 10 has pulse width counters 41 and 42, which measure the pulse widths of the phase comparison signals UP and DN based on the fast clock CLK; an OR gate 40, which detects the logical sum of the phase comparison signals UP and DN; a current adjustment signal generator 44, which compares the pulse widths measured by the pulse width counters 41 and 42 and generates current adjustment signals PSW1, 2, 3 and so on and NSW1, 2, 3 and so on such that the two pulse widths become equal; and a timing control unit 43 which controls operation of the pulse width counters 41, 42 and the current adjustment signal generator 44.

The charge pump adjustment circuit 10 detects a steady-state phase error when the PLL circuit is in the locked state by comparing the pulse widths of the phase comparison signals UP and DN, and performs variable control of the current adjustment signals PSW, NSW of the charge pump circuit 10 such that the pulse widths become equal. To this end, the timing control unit 43 detects the PLL circuit locked state based on whether the control voltage VCNTL of the voltage-controlled oscillator VCO has converged to a constant value. Or, the timing control unit 43 may detect the locked state based on a lock signal LOCK from a timer circuit, not illustrated, indicating that the time from the start of operation of the PLL circuit to the locked state has elapsed. This time until the locked state would be a time determined in advance in the PLL circuit design stage.

Upon detecting the locked state of the PLL circuit by using a method described above, the timing control unit 43 instructs the start of operation of the pulse width counters 41, 42 by means of a counter control signal 45. The two pulse width counters 41, 42 are reset in response to this counter control signal 45 instructing the start of operation, and during time period in which the phase comparison signals UP, DN are at H level, count the fast clock CLK. When the two phase comparison signals UP, DN go to L level, the output of the OR gate 40 goes to L level. In response to this, the timing control unit 43 instructs the start of operation of the current adjustment signal generator 44 by means of a control signal 46. In response to this, the current adjustment signal generator 44 compares the count values of the two pulse width counters 41 and 42, and controls the number of L levels of the current adjustment signals PSW1, 2, 3 and so on and the number of H levels of the current adjustment signals NSW1, 2, 3 and so on, such that the two pulse widths become equal. When adjustment of the current adjustment signals PSW, NSW is completed, the timing control unit 43 is notified of the completion of current adjustment by a control signal 47.

During current adjustment operation by the current adjustment signal generator 44, the timing control unit 43 temporarily halts operation of the pulse width counters 41, 42 by means of a counter control signal 45. And, in response to the completion of current adjustment, the timing control unit 43 waits until the control voltage VCNTL converges on a constant value and a locked state is detected. When a locked state is detected, the timing control unit 43 again starts operation of the pulse width counters 41, 42, and executes control of the same operations as above. When a locked state is detected and the pulse widths of the phase comparison signals UP, DN are equal, current adjustment operation ends.

By this means, after current adjustment of the charge pump circuit is performed a number of times, the PLL circuit is in the locked state in a state in which the pulse widths of the phase comparison signals UP, DN are equal. A state in which the pulse widths of the phase comparison signals UP, DN are equal is a state in which the phases of the reference clock REF and the feedback clock FB coincide, and the PLL circuit is adjusted to the ideal locked state in which steady-state phase error is suppressed, that is, is zero.

Figure 8:
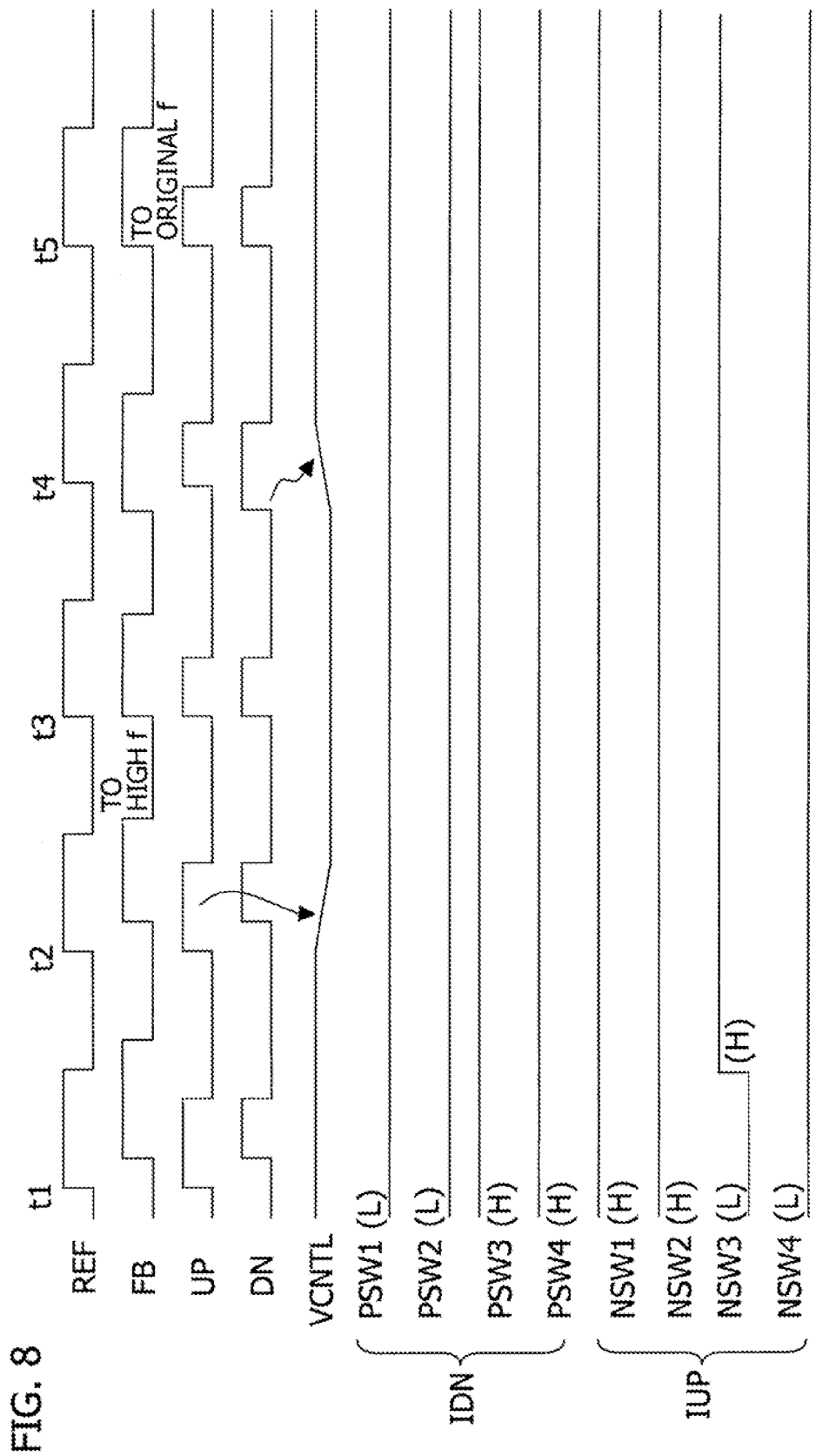
FIG. 8 is a timing chart illustrating an example of operation of the PLL circuit employing charge pump current adjustment by the charge pump adjustment circuit 10.

FIG. 8 is a timing chart illustrating an example of operation of the PLL circuit employing charge pump current adjustment by the charge pump adjustment circuit 10. In this operation example, a state such as that illustrated in FIG. 3 in which, in the PLL circuit locked state, the phase of the reference clock REF leads the phase of the feedback clock FB, is adjusted such that the phases of the two clocks coincide.

At time t1, the circuit is in a locked state, the frequencies of the reference clock REF and the feedback clock FB coincide (or one coincides with a multiple of N of the other), the control voltage VCNTL controlling the frequency of the voltage-controlled oscillator VCO is constant, and the frequency of the output clock OUT, not illustrated, is stable. However, the phase of the reference clock REF leads that of the feedback clock FB. Further, among the current adjustment signals PSW1 to PSW4 of the first charge pump current IDN causing the control voltage VCNTL to rise, two are at L level and the remaining two are at H level, and among the current adjustment signals NSW1 to NSW4 of the second charge pump current IUP causing the control voltage VCNTL to fall, two are at H level and the remaining two are at L level. The voltage-controlled oscillator VCO of this embodiment employs a circuit configuration such that when the control voltage VCNTL rises the frequency falls, and when the control voltage VCNTL falls the frequency rises.

The pulse width of the phase comparison signal UP is longer than that of the signal DN at time t1 in the locked state, so that the current adjustment signal generator 44 changes the current adjustment signal NSW3 from L to H. As a result, at time t2 the second charge pump current IUP increases, the control voltage VCNTL falls, and the frequencies of the output clock OUT and feedback clock FB rise. As a result, at time t3 the rising edge of the feedback clock FB has caught up to the rising edge of the reference clock REF. Further, due to fluctuations in the control voltage VCNTL, the PLL circuit is in the unlocked state.

However, at time t4 the rising edge of the feedback clock FB actually passes the rising edge of the reference clock REF, and leads in phase. As a result, the pulse width of the phase comparison signal DN becomes wider than that of UP, and at time t4, the control voltage VCNTL rises and returns to the original voltage, and the frequencies of the output clock OUT and feedback clock FB fall, returning to the frequencies at time t1.

Due to this fall in frequency, at time t5 a locked state is again entered, and the rising edge of the feedback clock FB is delayed, coinciding with the rising edge of the reference clock REF. In this state, the pulse widths of the phase comparison signals UP and DN are the same. The sole difference with time t1 is the fact that the current adjustment signal NSW3 is changed from L level to H level. This fact means that the current driving capacity on the N channel transistor side of the charge pump circuit CP is adjusted to be higher. That is, this means that the imbalance between the current driving capacity (IDN) on the P channel transistor side of the charge pump circuit CP and the current driving capacity (IUP) on the N channel transistor side has been resolved.

At time t1, the current value of the positive charge pump current IDN of the charge pump circuit CP was larger than that of the negative charge pump current IUP, and so in a state in which the phase of the reference clock REF led that of the feedback clock FB, a state existed in which the pulse width of the phase comparison signal UP was wider than that of the phase comparison signal DN. This locked state was adjusted to a locked state in which the phases of the reference clock REF and feedback clock FB coincided, and the pulse widths of the phase comparison signals UP and DN coincided, by resolving the imbalance in the current values of the two charge pump currents.

At time t4, the control voltage VCNTL fluctuates and the PLL circuit is in an unlocked state, so that current adjustment of the charge pump circuit by the charge pump adjustment circuit 10 based on comparison of the pulse widths of the phase comparison signals UP, DN is not performed. And, at time t5 and later a locked state is detected. In this locked state, the phases of the two clocks REF and FB coincide and the pulse width of the phase comparison signals UP and DN are equal, and so current adjustment by the charge pump adjustment circuit 10 is no longer performed.

When, opposite the situation in FIG. 8, the state is a locked state in which the phase of the feedback clock FB leads that of the reference clock REF, control is performed using logic opposite that of FIG. 8, the number of L levels of the current adjustment signals PSW is increased, the control voltage VCNTL temporarily rises, the frequency of the output clock OUT falls, and after the steady-state phase error has been suppressed, the control voltage VCNTL returns to the original value, and the frequency of the output clock OUT returns to the original value.

As described above, by means of this embodiment, adjustment is performed so as to resolve the imbalance in the current quantities of the first and second charge pump currents IDN, IUP within the charge pump circuit CP, so that a locked state in which the steady-state phase error illustrated in FIG. 3 is suppressed. And, in the example of the charge pump circuit of FIG. 6, the number of series circuits generating charge pump currents according to the phase comparison signals DNX, UP is adjusted by the current adjustment signals PSW, NSW, and the imbalance in the current values of the two charge pump currents is suppressed.

Figure 9:
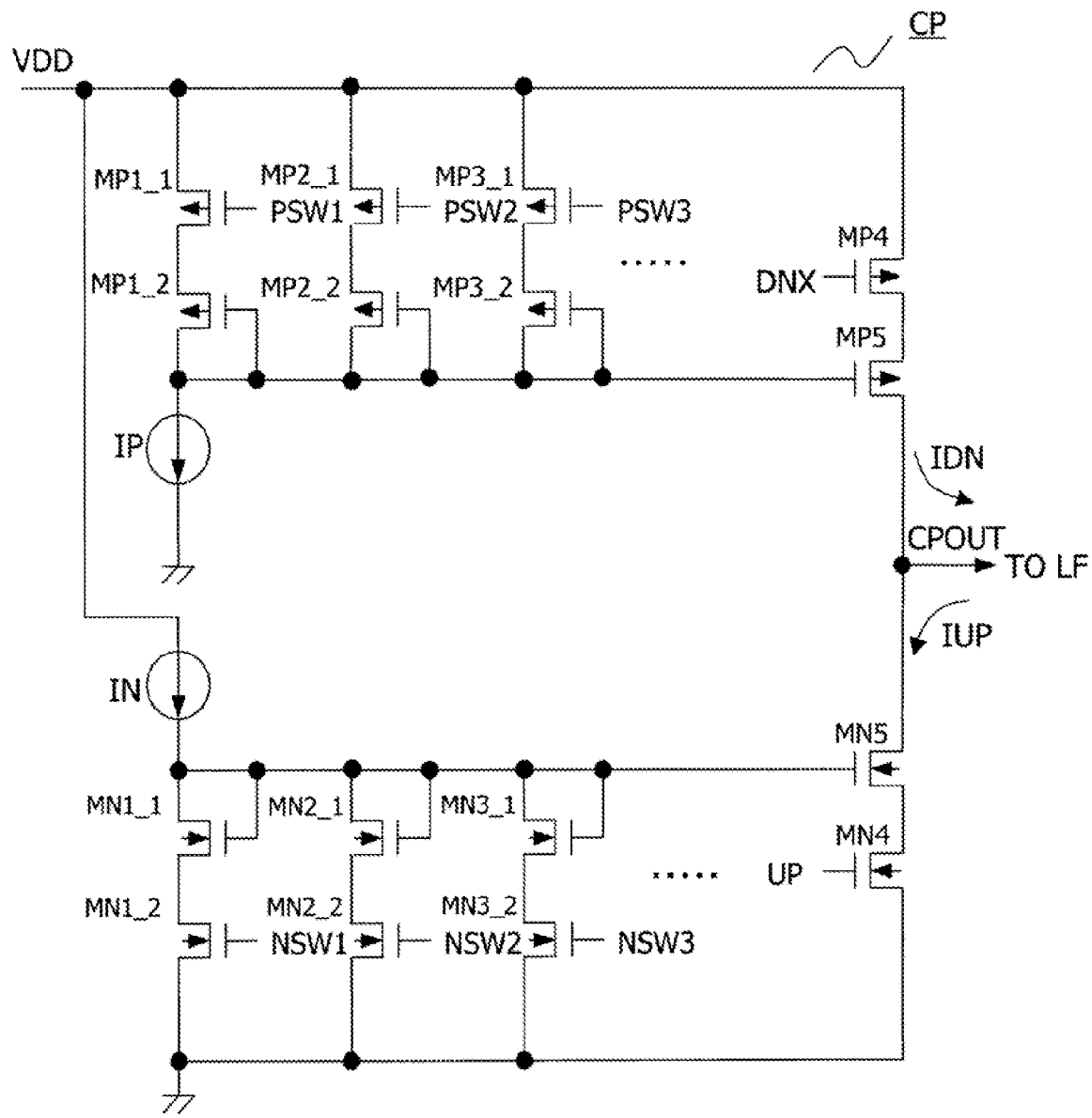
FIG. 9 is a circuit diagram of another charge pump circuit of this embodiment.

FIG. 9 is a circuit diagram of another charge pump circuit of this embodiment. In this example, the P channel transistor side generating the charge pump current IDN has a P channel transistor MP4 which is controlled to be conducting or non-conducting by the phase comparison signal DNX, and a transistor MP5 connected thereto, and the P channel transistors MP1_2, MP2_2, MP3_2, and so on, and MP5, constitute a current mirror circuit. And, when the current adjustment signals PSW1, 2, 3 and so on are at L level, the corresponding transistors MP1_1, MP2_1, MP3_1 and so on are conducting, a constant current IP is divided by these transistors MP1_1, MP2_1, MP3_1 and so on, and the larger the number of L levels of the current adjustment signals PSW, the smaller is the current quantity of the transistor MP5. For example, in a case where the channel widths of the transistors MP1_1, MP2_1, MP3_1 and so on are all equal, when the number of L levels of the current adjustment signals PSW is N, the current quantity of each transistor MP1_1, MP2_1, MPN_1 and so on is IP/N, and so the current quantity of transistor MP5 is also IP/N.

Similarly, the N channel transistor side which generates the charge pump current IUP has an N channel transistor MN4 which is controlled to be conducting or non-conducting by the phase comparison signal UP, and a transistor MN5 connected thereto; and the N channel transistors MN1_2, MN2_2, MN3_2 and so on, and MN5 constitute a current mirror circuit. And, when the current adjustment signals NSW1, 2, 3 and so on go to H level, the corresponding transistors MN1_1, MN2_1, MN3_1 and so on are conducting, a constant current IN is divided by these transistors MN1_1, MN2_1, MN3_1 and so on, and the larger the number of H levels of the current adjustment signals NSW, the smaller is the current quantity of the transistor MN5.

Opposite the situation of FIG. 6, in the charge pump circuit of FIG. 9 the current quantity of the charge pump current IDN decreases when the number of L levels of the current adjustment signals PSW increase, and the current quantity of the charge pump current IUP decreases when the number of H levels of the current adjustment signal NSW increases. That is, the current driving capacities of the transistors MP5, MN5 comprised by the current mirror circuits are adjusted so as to be smaller as the number of L levels of the current adjustment signals PSW and the number of H levels of the current adjustment signals NSW increase. Hence in the case of a PLL circuit in which the charge pump circuit of FIG. 9 is applied, the logic for generating current adjustment signals PSW, NSW by the charge pump adjustment circuit 10 must be the inversion of the above-described logic.

That is, in the example of FIG. 9, control is performed such that, for the phase comparison signal UP or DN with the larger pulse width, the number of L levels of the current adjustment signals PSW or the number of H levels of the current adjustment signals NSW is decreased. Further, control is executed such that when the pulse width of the phase comparison signal UP is larger, the number of L levels of the current adjustment signals PSW on the side generating the charge pump current IDN is increased and the IDN current quantity is increased, whereas when the pulse width of the phase comparison signal DN is larger, the number of H levels of the current adjustment signals NSW on the side generating the charge pump current IUP is increased and the IUP current quantity is increased.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present invention, has(have) been described in detail, it should be understood that the various changes, substitutions, and alterations could be made hereto without departing from the spirit and scope of the invention.

What is claimed is:

1. A PLL circuit, comprising:
    a phase comparator configured to compare phases of a reference clock and a feedback clock, and output a phase comparison signal indicating a difference between the phases;
    a charge pump circuit configured to, during a time period corresponding to the difference in phases indicated by the phase comparison signal, output a first charge pump current and a second charge pump current, generate the first charge pump current over a longer time period than the second charge pump current when the phase difference indicated by the phase comparison signal is positive, and generate the first charge pump current over a shorter time period than the second charge pump current when the phase difference is negative;
    a loop filter including a capacitor storing electric charge based on the first and second charge pump currents, and configured to generate a control voltage due to stored electric charge, one of the first and second charge pump currents being a charging current which charges the capacitor; and the other one of the first and second charge pump currents being a discharging current which discharges the capacitor;
    an oscillator configured to generate an output clock at a frequency according to the control voltage;
    a frequency divider configured to frequency-divide the output clock and output the feedback clock; and
    a charge pump adjustment circuit configured to, when in a locked state, adjust current quantity of the first or the second charge pump current such that the difference in current values of the first and second charge pump currents is suppressed and the phase difference is suppressed, according to the phase difference indicated by the phase comparison signal.

2. The PLL circuit according to claim 1, wherein, when in an unlocked state, the charge pump adjustment circuit does not adjust the current value of the first or the second charge pump current.

3. The PLL circuit according to claim 1, wherein
    the charge pump circuit includes a first current generation circuit which generates the first charge pump current, and a second current generation circuit which generates the second charge pump current;
    the first current generation circuit generates the first charge pump current during a time period according to the phase difference indicated by the phase comparison signal, and adjusts the current value of the first charge pump current according to the first current adjustment signal output by the charge pump adjustment circuit; and the second current generation circuit generates the second charge pump current during a time period according to the phase difference indicated by the phase comparison signal, and adjusts the current value of the second charge pump current according to the second current adjustment signal output by the charge pump adjustment circuit.

4. The PLL circuit according to claim 3, wherein
the first current generation circuit includes a plurality of first current generation units provided in parallel between a first voltage and an output terminal, and a number of first current generation units according to the first current adjustment signal generate the first charge pump current during a time period according to the phase difference indicated by the phase comparison signal; and
the second current generation circuit includes a plurality of second current generation units provided in parallel between a second voltage and an output terminal, and a number of second current generation units according to the second current adjustment signal generate the second charge pump current during a time period according to the phase difference indicated by the phase comparison signal.

5. The PLL circuit according to claim 4, wherein
the first current generation unit includes a first transistor which is controlled to be conducting or non-conducting according to the phase comparison signal, a second transistor which is controlled to be conducting or non-conducting according to the first current adjustment signal, and a third transistor which generates a prescribed current, and the first, second and third transistors are connected in series between the first voltage and output terminal; and
the second current generation unit includes a fourth transistor which is controlled to be conducting or non-conducting according to the phase comparison signal, a fifth transistor which is controlled to be conducting or non-conducting according to the second current adjustment signal, and a sixth transistor which generates a prescribed current, and the fourth, fifth and sixth transistors are connected in series between the second voltage and output terminal.

6. The PLL circuit according to claim 3, wherein
the first current generation circuit includes, between a first voltage and an output terminal, a first transistor and first current source transistor, the first current source transistor generates a current according to the first current adjustment signal, and the first transistor outputs the current of the first current source transistor to the output terminal as the first charge pump current during a time period according to the phase difference indicated by the phase comparison signal; and the second current generation circuit includes, between a second voltage and an output terminal, a second transistor and second current source transistor, the second current source transistor generates a current according to the second current adjustment signal, and the second transistor outputs the current of the second current source transistor to the output terminal as the second charge pump current during a time period according to the phase difference indicated by the phase comparison signal.

7. The PLL circuit according to claim 6, wherein
the first current generation circuit further includes the first current source transistor and a plurality of first current mirror transistors forming a first current mirror circuit, and a first current mirror current flows in a number of first current mirror transistors according to the first current adjustment signal; and
the second current generation circuit further includes the second current source transistor and a plurality of second current mirror transistors forming a second current mirror circuit, and a second current mirror current flows in a number of second current mirror transistors according to the second current adjustment signal.

8. A method of adjustment of a PLL circuit including a phase comparator configured to compare phases of a reference clock and feedback clock and output a phase comparison signal indicating a difference between the phases, a charge pump circuit configured to output a first charge pump current and second charge pump current during a time period according to the difference in phases indicated by the phase comparison signal, generate the first charge pump current over a longer time period than the second charge pump current when the phase difference indicated by the phase comparison signal is positive, and generate the first charge pump current over a shorter time period than the second charge pump current when the phase difference is negative, a loop filter including a capacitor which stores electric charge based on the first and second charge pump currents and configured to generate a control voltage due to stored electric charge, one of the first and second charge pump currents being a charging current which charges the capacitor; and the other one of the first and second charge pump currents being a discharging current which discharges the capacitor, an oscillator configured to generate an output clock at a frequency according to the control voltage, and a frequency divider configured to frequency-divide the output clock and output the feedback clock, the method comprising:
adjusting, when in a locked state, a current value of the first or second charge pump current such that the difference in current values of the first and second charge pump currents is suppressed and the phase difference is suppressed, according to the difference in phases indicated by the phase comparison signal.

* * * * *